United States Patent
Suenaga et al.

(10) Patent No.: US 6,883,283 B2
(45) Date of Patent: Apr. 26, 2005

(54) SEMICONDUCTOR MANUFACTURING FACILITY AND A SEMICONDUCTOR MANUFACTURING METHOD

(75) Inventors: Osamu Suenaga, Nirasaki (JP); Kazuo Yamamoto, Nirasaki (JP); Kaoru Fujihara, Nirasaki (JP); Sadao Kobayashi, Tokyo (JP)

(73) Assignees: Tokyo Electron Limited, Tokyo (JP); TAISEI Corporation, Tokyo (JP)

( * ) Notice: Subject to any disclaimer, the term of this patent is extended or adjusted under 35 U.S.C. 154(b) by 95 days.

(21) Appl. No.: 10/103,135

(22) Filed: Mar. 22, 2002

(65) Prior Publication Data

US 2002/0155731 A1 Oct. 24, 2002

(30) Foreign Application Priority Data

Mar. 23, 2001 (JP) ........................................ 2001-086178

(51) Int. Cl.$^7$ .............................................. E02D 27/00
(52) U.S. Cl. ........................ 52/299; 52/294; 52/737.1; 248/678; 248/679
(58) Field of Search ................................ 52/274, 721.2, 52/721.4, 721.5, 299, 294, 737.1; 248/678, 679

(56) References Cited

U.S. PATENT DOCUMENTS

| | | | | | |
|---|---|---|---|---|---|
| 3,108,403 A | * | 10/1963 | Jackson | ...................... | 52/169.9 |
| 4,682,754 A | * | 7/1987 | Ebata et al. | ................. | 248/639 |
| 4,918,891 A | * | 4/1990 | Gerszewski | ................... | 52/295 |
| 5,210,991 A | * | 5/1993 | Hakala et al. | ............ | 52/742.14 |
| 5,863,017 A | * | 1/1999 | Larson et al. | ............. | 248/176.1 |
| 5,946,867 A | * | 9/1999 | Snider et al. | ............... | 52/167.1 |
| 6,167,672 B1 | * | 1/2001 | Okitomo | ..................... | 52/721.4 |
| 2002/0171815 A1 | * | 11/2002 | Matsuyama et al. | ........... | 355/55 |

FOREIGN PATENT DOCUMENTS

JP        2002-106100        4/2002

OTHER PUBLICATIONS

Christian Meyer, Design of Concrete Structures, 1996, Prentice Hall, pp. 342–347 and 492–495.*

* cited by examiner

Primary Examiner—Brian E. Glessner
(74) Attorney, Agent, or Firm—Pillsbury Winthrop LLP

(57) ABSTRACT

A semiconductor manufacturing facility has a proper strength and an anti-vibration effect. The semiconductor facility contains processing apparatuses, installation tables and an installation floor. An apparatus having a vibration source is installed on an installation table having a rigid structure. The installation table is installed on the installation floor having a floor construction including a plurality of columns, which support a floor member extending in horizontal directions. An interval of the columns is 4 m to 12 m.

6 Claims, 3 Drawing Sheets

SEMICONDUCTOR MANUFACTURING FACILITY AND A SEMICONDUCTOR MANUFACTURING METHOD

BACKGROUND OF THE INVENTION

1. Field of the Invention

The present invention relates to semiconductor manufacturing facilities and, more particularly, to a semiconductor manufacturing facility including an apparatus that generates vibration such as a scan-type exposure apparatus, which applies an exposure process to a semiconductor wafer, and a semiconductor manufacturing method performed by such a semiconductor manufacturing facility.

2. Description of the Related Art

In order to raise a manufacturing efficiency in a semiconductor manufacturing process, a diameter of a semiconductor wafer tends to increase and is presently shifting from a wafer with a diameter of 200 mm (8 inches) to a wafer with a diameter of 300 mm (12 inches). In connection with such a shift in the semiconductor wafer, semiconductor manufacturing apparatuses and semiconductor manufacturing facilities are also becoming large-scaled.

For example, a scan-type exposure apparatus handling a wafer with a diameter of 300 mm in a lithography apparatus is provided with a mechanism for moving a stage on which a light-source is provided, in addition to a mechanism for moving a wafer stage on which a wafer to be processed is placed. For this reason, the scan-type exposure apparatus handling the wafer with a diameter of 300 mm has a weight as heavy as 9.5 tons. Therefore, an installation floor of a clean room on which such a heavyweight scan-type exposure apparatus is installed requires an increased withstand load. Although the scan-type exposure apparatus has a precise moving mechanism and must be made so that vibration is not transmitted thereto from outside, the apparatus itself is a source of vibration since the apparatus has a mechanism that intermittently moves the stages.

The conditions of installation of the above-mentioned scan-type exposure apparatus have mainly been established according to a request from manufacturers of the apparatus. That is, it is required by the manufacturers of a scan-type exposure apparatus that the conditions of the following items should be satisfied with respect to a weight and vibration characteristic of the installation floor.

(1) Acceleration of vibration in ⅓ octave-band peak-hold analysis O-P value (2) Acceleration of vibration (O-P) value in a time history waveform (3) Target accelerance of an installation floor of an exposure apparatus In order to satisfy such vibration conditions, it is general to provide an installation table or stand on an installation floor of a clean room so as to install a scan-type exposure apparatus on the installation table. As for the installation table, there is an approach of interrupting transmission of vibration by rigidity and weight of concrete. There also is an approach using an anti-vibration table, which prevents transmission of vibration by a damping mechanism incorporated in the installation table.

However, a weight of a concrete installation table, which satisfies vibration conditions required by the scan-type exposure apparatus handling the wafer with a diameter of 300 mm, is as large as 11 tons, and becomes about 20 tons if when the weight of the apparatus itself is added. Therefore, the installation floor of the clean room must be so designed and constructed to withstand such a large load.

Generally, the installation floor of a clean room consists of slabs supported by columns. However, in order to make the installation floor supporting a weight of about 20 tons, the number of columns must be increased very much and such a floor may not be designed by a conventional design method. Moreover, once the concrete installation table is constructed, it is difficult to move the installed position thereof. Accordingly, the concrete installation table gives less freedom of an installation position of the apparatus in the clean room. Therefore, there is a problem in that a layout of apparatuses in a clean room cannot be changed.

Thus, there is a case in which an anti-vibration table is used instead of the concrete installation table. FIG. 1 is an illustrative view of a conventional installation construction of a lithography apparatus. The lithography apparatus shown in FIG. 1 has a scan-type exposure apparatus 10 and a coater/developer apparatus 12. The scan-type exposure apparatus 10 has a very large weight, and generates vibration during operation. A laser light for exposure is supplied to the scan-type exposure apparatus 10 from a laser oscillator 14.

The scan-type exposure apparatus 10 is installed on an anti-vibration table 16 so that vibration generated by the apparatus 10 is not transmitted to other apparatuses. The anti-vibration table 16 is also referred to as an active vibration-eliminating table, and is provided with a damping device. That is, the anti-vibration table 16 does not only prevent vibration from being transmitted to the scan-type exposure apparatus 10 but also has a special mechanism to interrupt vibration generated by the apparatus itself so that the vibration is not transmitted outside. The anti-vibration table 16 is installed on an installation floor 18 of a clean room.

A coater/developer apparatus 12 and a laser oscillator 14 are installed on a free access floor panel 20, which is provided on the installation floor 18 of the clean room. Although the anti-vibration table 16 and the free access floor panel 20 are arranged on the same installation floor 18, they are separated from each other and do not contact to each other. The installation floor 18 consists of slabs each of which is supported by a plurality of columns 22 from the bottom side. Since the scan-type exposure apparatus 10 is very heavy and is arranged on the anti-vibration table 16, the number of columns must be increased so that the installation floor withstands such a weight and vibration is not transmitted thereto.

Considering layout change of apparatuses in a clean room, it is desirable to make the installation floor 18 a uniform configuration, and, thereby, the columns 22, which support the installation floor 18, are arranged at a uniform interval. That is, the interval D of the column 22 supporting the installation floor 18 of the clean room is determined by an interval required for a part where the scan-type exposure apparatus 10 and the anti-vibration table 16 are arranged, and, thus, the columns 22 must be located at a very small interval over the entire clean room. Therefore, The installation floor has an excessive withstand load in parts other than the part where the scan-type exposure apparatus 10 is installed. Moreover, the anti-vibration table 16 per se becomes very heavy since the special damping device is provided, and the structure thereof also becomes complicated.

Moreover, even when the above-mentioned anti-vibration table 16 is used, the summed weight of the scan-type exposure apparatus 10 and the anti-vibration table 16 is very large. Therefore, according to a conventional design approach, the interval D between the columns 22 must be decreased to about 3.5 m. However, if the interval D of the columns 22 becomes small, a new problem may arise. Generally, devices (accessories) relevant to an apparatus installed on a part of the installation floor 18 directly above the devices are located underneath the installation floor 18. However, if the interval D of the columns 22 is decreased, a space where the accessories are located is also decreased, and, thereby, the accessories cannot be accommodated within a predetermined range. That is, there is a problem in that the accessories to be provided under the installation floor 18 cannot be arranged well although various apparatuses can be arranged in the clean room.

SUMMARY OF THE INVENTION

It is a general object of the present invention to provide an improved and useful semiconductor manufacturing facility in which the above-mentioned problems are eliminated.

A more specific object of the present invention is to provide a semiconductor manufacturing facility having a proper strength and an anti-vibration effect as a whole facility containing processing apparatuses, installation tables and an installation floor.

In order to achieve the above-mentioned objects, there is provided according to one aspect of the present invention a semiconductor manufacturing facility including an apparatus having a vibration source, comprising: an installation table having a rigid structure on which the apparatus having a vibration source is installed; and a floor construction on which the installation table is installed, wherein the floor construction includes a plurality of columns which support a floor member extending in horizontal directions, and an interval of the columns is 4 m to 12 m.

In the semiconductor manufacturing facility according to the present invention, the floor construction may be designed to have a predetermined accelerance. The predetermined accelerance may be a set accelerance which is obtained by dividing a necessary accelerance by a predetermined factor, the necessary accelerance being obtained by dividing a vibration allowable value A required for the apparatus by a vibration force F generated by the apparatus, where the vibration allowable value A is expressed by acceleration.

Additionally, each of the columns of the floor construction may have a steel-reinforced concrete structure, and a diameter of each of the columns is 600 mm to 1400 mm. Alternatively, each of the columns of the floor construction may have a steel-frame structure, and a diameter of each of the columns is 600 mm to 1400 mm. Otherwise, each of the columns of the floor construction may be a concrete-filled steel pipe having a diameter of 600 mm to 1400 mm. Further, the installation table may have a steel-frame structure. Alternatively, the installation table has a steel-reinforced concrete structure.

Additionally, there is provided according to another aspect of the present invention a semiconductor manufacturing facility including an apparatus having a vibration source, comprising: an exposure apparatus capable of handling a semiconductor wafer having a diameter equal to or greater than 300 mm; an installation table having a rigid structure on which the exposure apparatus is installed; and a floor construction on which the installation table is installed, wherein the floor construction includes a plurality of columns which support a floor member extending in horizontal directions, and an interval of the columns is 4 m to 12 m.

In the semiconductor manufacturing facility according to the above-mentioned invention, the floor construction may be designed to have a predetermined accelerance. The predetermined accelerance may be a set accelerance which is obtained by dividing a necessary accelerance by a predetermined factor, the necessary accerelance being obtained by dividing a vibration allowable value A required for the apparatus by a vibration force F generated by the apparatus, where the vibration allowable value A is expressed by acceleration.

The semiconductor manufacturing facility according to the present invention may further comprise: a coater installed on the floor construction so as to apply a photoconductive material onto a semiconductor wafer to be supplied to the exposure apparatus; a developer installed on the floor construction so as to apply a development process to a semiconductor wafer after being exposed by the exposure apparatus; and a light-source apparatus which supplies a light beam for exposure to the exposure apparatus.

Additionally, there is provided according another aspect of the present invention a semiconductor manufacturing method using a semiconductor manufacturing facility including an apparatus having a vibration source, the semiconductor manufacturing method comprising the steps of: applying a photo-resist onto a semiconductor wafer by a coater/developer apparatus installed on a floor construction including a plurality of columns which support a floor member extending in horizontal directions, an interval of the columns being 4 m to 12 m; applying an exposure process to the semiconductor wafer by a scan-type exposure apparatus which is installed on the floor construction and capable of processing a semiconductor wafer having a diameter equal to or greater than 300 mm; and applying a development process to the semiconductor wafer, which has been exposed by the exposure apparatus, by the coater/developer apparatus.

According to the present invention, the floor construction on which the semiconductor manufacturing apparatuses are installed in the semiconductor manufacturing facility can be constructed with a smaller weight and simpler structure than a floor construction according to a conventional design method. That is, the number of columns in the floor structure can be less than the number of columns according to a conventional design method, thereby simplifying the structure of floor construction. Additionally, an area of a space under the installation floor is increased, and, thereby, a sufficiently large space can be reserved for arranging auxiliary devices relating to the apparatuses installed on the installation floor. Further, the installation table can be a simple structure such as a steel-frame structure, and is movable to an arbitrary position on the installation floor.

Other objects, features and advantages of the present invention will become more apparent from the following detailed descriptions when read in conjunction with the accompanying drawings.

DETAILED DESCRIPTION OF THE PREFERRED EMBODIMENT

Figure 1:
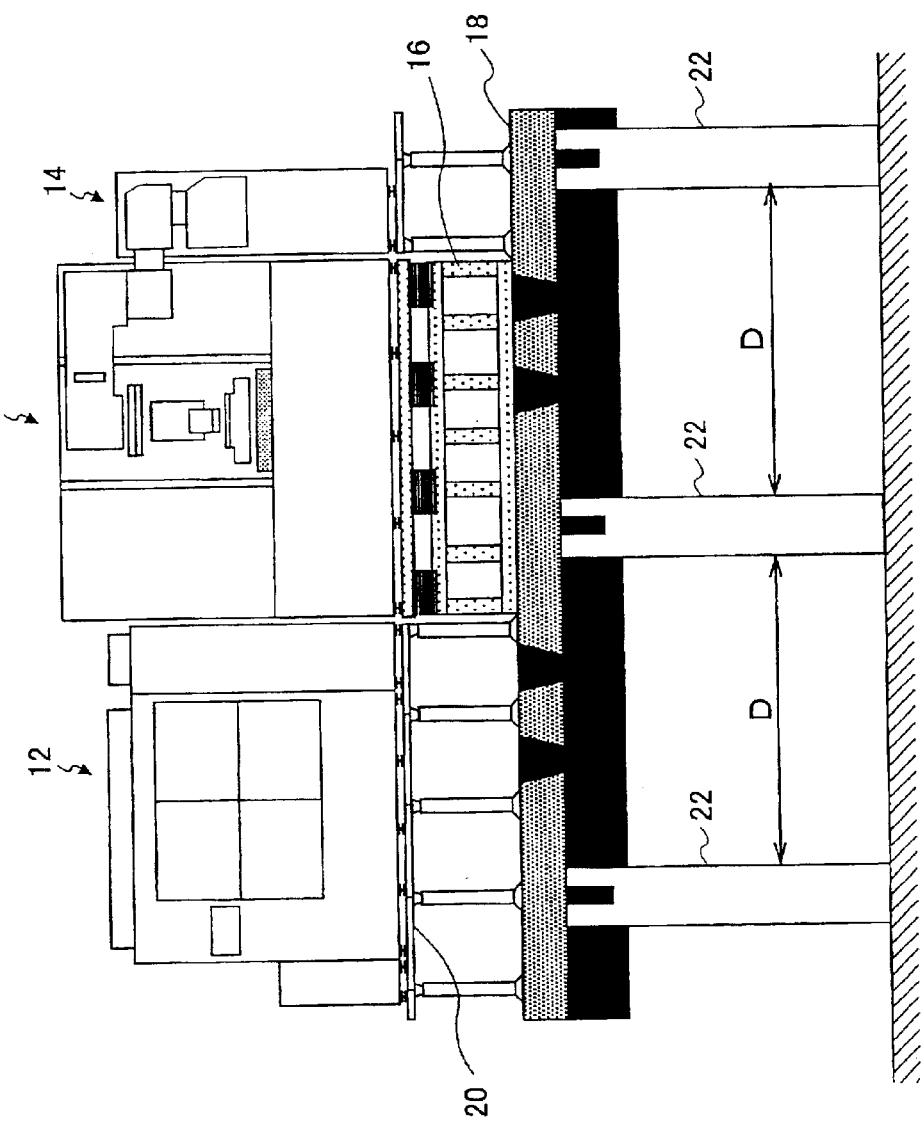
FIG. 1 is an illustrative view of a conventional installation construction of a lithography apparatus.
Figure 2:
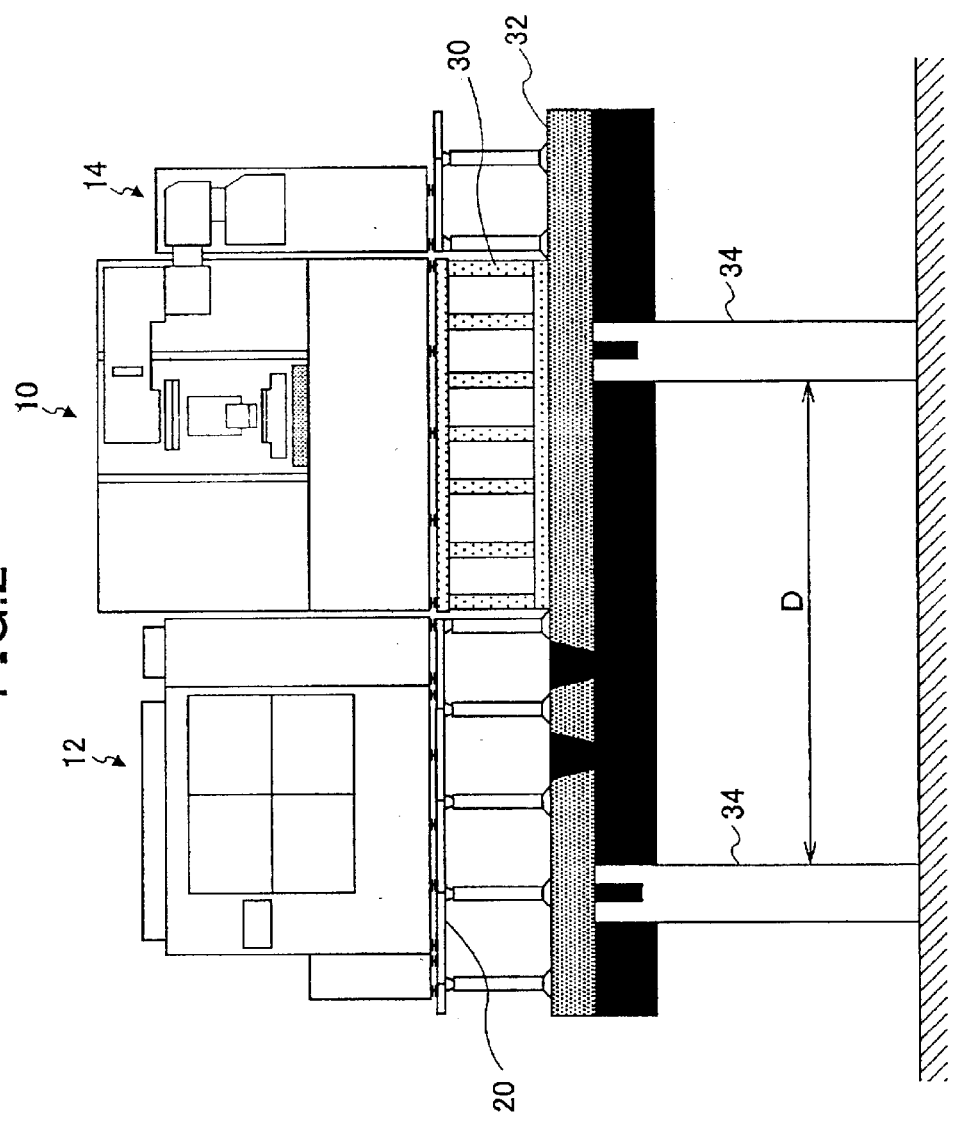
FIG. 2 is an illustrative view of a semiconductor manufacturing facility according to an embodiment of the present invention.

A description will now be given, with reference to FIG. 2, of an embodiment of the present invention. FIG. 2 is an illustrative view of a semiconductor manufacturing facility according to an embodiment of the present invention. In FIG. 2, parts that are the same as the parts shown in FIG. 1 are given the same reference numerals.

The semiconductor manufacturing facility shown in FIG. 2 comprises a lithography apparatus, and has a scan-type exposure apparatus 10 and a coater/developer apparatus 12. The scan-type exposure apparatus 10 has a structure, which can handle a wafer with a diameter of 300 mm, thereby having a very large weight. A laser light for exposure is supplied to the scan-type exposure apparatus 10 from a laser oscillator 14. It should be noted that the light beam for exposure supplied to the exposure apparatus 10 is not limited to the laser light, and, for example, an X-ray, an electron beam, etc. may be used as the light beam for exposure.

Since the scan-type exposure apparatus 10 generates vibration during operation, the scan-type exposure apparatus 10 is installed on an installation table 30, which is separated from other apparatuses, so that the vibration may not be transmitted to other apparatuses. The installation table 30 is formed as a steel-frame structure so as to be a rigid body. The installation table 30 does not only prevent vibration from being transmitted to the scan-type exposure apparatus 10 from outside but also interrupt vibration generated by the apparatus itself so that the vibration is not transmitted outside. The installation table 30 is installed on an installation floor 32 of a clean room. It should be noted that the installation table 30 is not limited to the steel-frame structure, and, for example, a steel-reinforced concrete structure may be used.

The coater/developer apparatus 12 and the laser oscillator 14 are installed on a free access floor panel 20, which is provided on the installation floor 32 of the clean room. The installation table 30 and the free access floor panel 20 are arranged on the same installation floor 32 so as to be separated from each other so that the installation table 30 and the free access floor panel 20 do not contact with each other.

The installation floor 32 is made of a slab floor such as a waffle slab. The slab floor is supported by a plurality of columns 34 from the bottom side. The scan-type exposure apparatus 10 having a large weight is arranged on the installation table 30. Therefore, if a conventional design approach is used, the number of columns 34 must be increased so as to support such a heavy weight and to make an installation floor, which can prevent transmission of vibration.

However, in the semiconductor manufacturing facility according to the present invention, a damping function is achieved by the cooperation of the columns 34, the installation floor 32 and the installation table. Thus, even if an interval between the columns 34 is large and the installation table 34 has a steel-frame structure, a semiconductor manufacturing facility, which is sufficiently usable with respect to vibration, can be constructed. That is, according to the present invention, a vibration value at the installation table 30 satisfies a ⅓ octave-band vibration allowable value, which is required for the scan-type exposure apparatus 10. Moreover, the present invention is base on the discovery that there is no problem relating to a use environment if an accelerance of the installation floor 32 is equal to or smaller than a predetermined value.

According to the present invention, the installation table 30 and the installation floor 32 are designed so as to have a set accelerance, which is obtained by dividing a necessary accelerance by a predetermined safety factor. The necessary accelerance is a value which is obtained by dividing a vibration allowable value A required for the scan-type exposure apparatus 10 by a vibration-force time history waveform F generated by the scan-type exposure apparatus 10, where the vibration allowable value A is expressed in acceleration. The predetermined safety factor can be a value within a range of 2–7.

Figure 3:
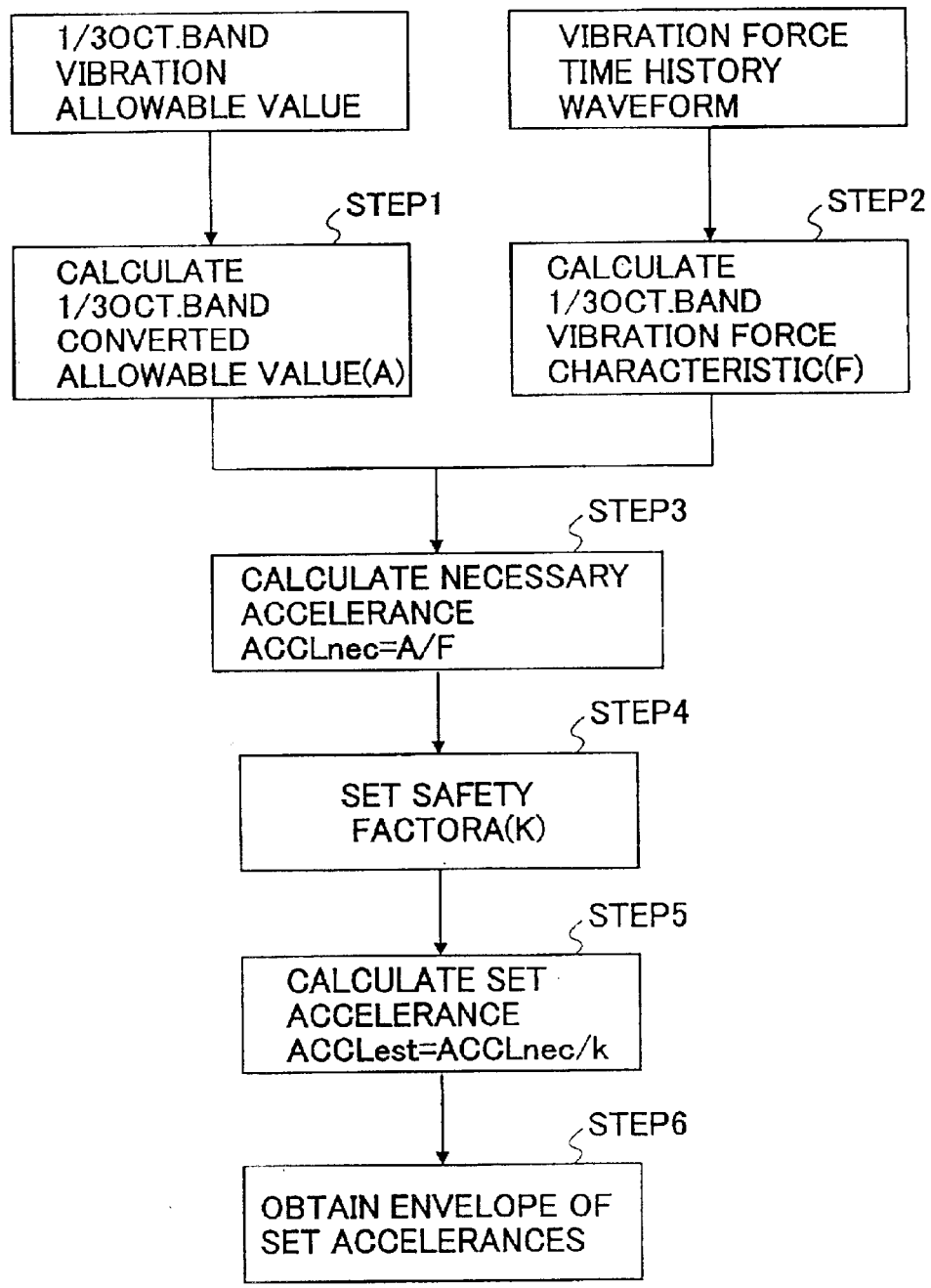
FIG. 3 is a flowchart of a design method of a floor construction used in the semiconductor manufacturing facility shown in FIG. 2.

A description will be given below, with reference to a flowchart of FIG. 3, of the design approach. In step 1, the vibration allowable value expressed in acceleration (⅓ octave-band peak hold analysis O-P value) is converted into a ⅓ octave-band peak hold analysis rms value so as to calculate a converted vibration allowable value A (unit: gal) expressed in acceleration, where the vibration allowable value is presented as an installation condition of the exposure apparatus 10 by a manufacturer thereof. Additionally, in step 2, a frequency analysis is performed on a vibration-force time history waveform generated by the exposure apparatus 10 so as to calculate a ⅓ octave-band vibration force F (unit: N).

Subsequently, in step 3, a necessary accelerance (ACCLnec=A/F, unit: gal/N) is calculated based on the above-mentioned converted vibration allowable value A and vibration force F. The necessary accelerance is a threshold limit value which satisfies the ⅓ octave-band vibration allowable value A in the state where only the vibration influence of the scan-type exposure apparatus 10 is input to the installation table 30. However, in an actual clean room in which the scan-type exposure apparatus 10 is installed, there exist various sources of vibration such as other manufacturing equipments and piping construction, etc. provided within the clean room. Vibrations generated by the vibration sources are input to the installation table 30 through the floor structure including the installation floor 32. Thus, it is necessary to provide an allowance to the accelerance of the floor structure.

Thus, in step 4, a required safety factor k is set according to the number of surrounding vibration sources or a magnitude of vibration. Then, in step 5, the necessary accelerance is divided by the safety factor k so as to calculate the set accelerance (ACCLest=ACCLnec/k, unit: gal/N). When an amount of energy is concerned, it is known that an influence given by a smaller energy matter to a larger energy matter is almost negligible if a difference between the two energy values exceeds 3 times. Therefore, the safety factor k is usually about 3, although it depends on an amount of vibration transmitted from surrounding vibration sources. If the safety factor k is smaller than 2, there are many cases in which a given vibration condition cannot be satisfied. On the other hand, if the safety factor k is greater than 7, it becomes over-design and is not preferable from a viewpoint of acquiring an installation space for other equipments or a viewpoint of economical efficiency. For this reason, it is preferable that the safety factor k is set to an optimum value within a range of 2–7 in response to surrounding vibration sources.

The thus-obtained set accelerance satisfies requirements with respect to vibration influence of the scan-type exposure apparatus 10 to the installation table 30. Moreover, the thus-obtained set accelerance satisfies the ⅓ octave-band vibration allowable value A with a certain degree of allowance also in the state where other vibrations are input from peripheral equipments. The set accelerance (ACCLest) takes various values depending on frequencies. Therefore, in step 6, a final set accelerance is obtained as a value, which envelopes the various values of the set accelerance. It should be noted that, in the above-mentioned design approach, the floor construction including the installation table 30 and the installation floor 32 as a whole may be designed and constructed so as to satisfy the above-mentioned set accelerance. More preferably, each of the floor construction and the installation table 30 is designed and constructed so as to have the above-mentioned set accelerance individually. In such a case, it is preferable that the installation table 30 is designed and constructed so as to have a natural frequency of 70 Hz or more.

A description will now be given of examples of the floor structure that is designed according to the above-mentioned design approach.

In a case of the floor construction having a steel-reinforced concrete structure, the columns 34 having a thickness of 600 mm–1400 mm are arranged at an interval of 4 m–12 m. Large beams of 600 mm–1400 mm and small beams of 300 mm–1000 mm are arranged between the upper ends of the columns 34. Then, the installation floor 32 of a slab-beam type is constructed by forming a slab floor having a thickness of 70 mm–300 mm on the large and small beams. In a case in which the slab floor is not formed as the installation floor 32, a structure having grandchild beams of 300 mm–1000 mm arranged between the above-mentioned beams may be applicable.

Additionally, in another example of the floor construction, the columns 34 having a steel structure or a concrete filled steel-pipe structure having a thickness of 400 mm–1000 mm are arranged at an interval of 4 m–12 m. Large beams of 500 mm–1400 mm having a steel-frame structure or a steel-reinforced concrete structure and small beams of 300 mm–1000 mm having a steel-frame structure or a steel-reinforced concrete structure are arranged between the upper ends of the columns 34. A floor slab having a thickness of 70 mm–300 mm is formed on the large and small beams.

Moreover, in a case in which the above-mentioned floor structure does not have a slab, the columns 34 having a steel structure or a concrete filled steel-pipe structure having a thickness of 400 mm–1000 mm are arranged at an interval of 4 m–12 m. Large beams of 500 mm–1400 mm having a steel-frame structure or a steel-reinforced concrete structure, small beams of 300 mm–1000 mm having a steel-frame structure or a steel-reinforced concrete structure and grandchild beams of 300 mm–1000 mm having a steel-frame structure or a steel-reinforced concrete structure are arranged between the upper ends of the columns 34.

In the case where a design is carried out using the above-mentioned set accelerance, sufficient measures for fine vibration can be achieved even when the installation table 30 having a steel-frame structure is installed on the installation floor 32. Since the installation table 30 having a steel-frame structure is lighter than a table made from concrete, a load applied to the floor construction can be reduced. For this reason, an amount of steel frames used for the floor construction can be reduced. In addition, when the installation table 30 having a steel-frame structure is used, an amount of dust is greatly reduced as compared to the concrete table. Therefore, the installation table 30 is more suitable for an installation table installed in a clean room in which generation of dust must be eliminated.

Moreover, even in a case where a layout of apparatuses is changed due to a change in a manufacturing process, the installation table 30 can be moved to an arbitrary position on the installation floor 32. Therefore, a degree of freedom of arrangement of the apparatuses in a semiconductor manufacturing facility can be improved.

Additionally, the horizontal rigidity of the installation table 30 can be easily adjusted by adding ribs and connection bolts. Moreover, the vertical rigidity can be almost the same as the rigidity of the floor construction by adding ribs. Thus, by designing a floor construction using the above-mentioned set accelerance, the installation table 30 of the exposure apparatus can be fabricated while attempting adjustment with a floor construction, and a practical semiconductor manufacturing facility having a lightweight as a whole can be achieved.

In addition, in the above-mentioned embodiment, although the case, where the present invention is applied to the installation floor where the scan-type exposure apparatus handling a wafer with a diameter of 300 mm is installed, is explained, the present invention is not limited to the exposure apparatus. That is, the present invention is applicable to other installation floors on which a heavy apparatus having a vibration source is installed.

Moreover, although, in the above-mentioned embodiment, a vibration-force time-history waveform F is used as a vibration force for calculating the necessary accelerance, the present invention is not limited to the vibration force. For example, other characteristic values representing a vibration force of the apparatus such as a vibration force spectrum may be used.

The present invention is not limited to the specifically disclosed embodiments, and variations and modifications may be made without departing from the scope of the present invention.

The present application is based on Japanese priority application No. 2001-086178 filed on Mar. 23, 2001, the entire contents of which are hereby incorporated by reference.

What is claimed is:

1. A semiconductor manufacturing facility including an apparatus having a vibration source, comprising:

an installation table having a rigid structure on which the apparatus having a vibration source is installed; and a floor construction on which said installation table is installed, wherein said floor construction includes a floor member extending in a horizontal direction and a plurality of columns supporting the floor member, and said floor member has an accelerance calculated by:

converting an allowable vibration value expressed in acceleration of said apparatus into a ⅓ octave-band peak hold analysis rms value;

performing a frequency analysis on a vibration-force time history waveform obtained from said apparatus so as to calculate a ⅓ octave-band vibration force expressed in ⅓ octave-band peak hold analysis rms value;

calculating a necessary accelerance ACCLnec by dividing the allowable vibration value by the vibration force obtained by performing the frequency analysis in a range of observed frequencies;

setting a safety factor k to a value in a range of 2 to 7 in accordance with a number of vibration sources around said apparatus and magnitude of vibrations from the vibration sources so as to eliminate influences of vibrations transmitting from the vibration sources;

setting a set accelerance ACCLest by dividing said necessary accelerance ACCLnec by the safety factor k; and determining an accelerance to be used for construction design that covers any value of said necessary accelerance ACCLnec that varies with frequencies of vibration from said apparatus.

2. The semiconductor manufacturing facility as claimed in claim 1, wherein said apparatus having a vibration source is a semiconductor manufacturing apparatus, said semiconductor manufacturing apparatus being capable of processing a semiconductor wafer having a diameter equal to or larger than 300 mm.

3. The semiconductor manufacturing facility as claimed in claim 1, wherein said installation table comprises a highly rigid member having a natural frequency of 70 Hz or more.

4. The semiconductor manufacturing facility as claimed in claim 1, wherein each of said plurality of columns has one of a steel-reinforced concrete structure, a steel-frame structure and a concrete-filled steel pipe structure, and a thickness of each of said plurality of columns is 600 mm to 1400 mm, and an interval between adjacent columns in said plurality of columns is 4 m to 12 m.

5. The semiconductor manufacturing facility as claimed in claim 1, wherein said apparatus having a vibration source is an exposure apparatus, said exposure apparatus being capable of processing a semiconductor wafer having a diameter equal to or larger than 300 mm.

6. A semiconductor manufacturing facility as claimed in claim 5, further comprising:

a coater installed on said floor construction so as to apply a photoconductive material onto a semiconductor wafer to be supplied to said exposure apparatus;

a developer installed on said floor construction so as to apply a development process to a semiconductor wafer after being exposed by said exposure apparatus; and a light-source apparatus adapted to supply a light beam for exposure to said exposure apparatus.

* * * * *